(12) United States Patent
Mease et al.

(10) Patent No.: US 7,652,872 B1
(45) Date of Patent: Jan. 26, 2010

(54) MEMORY MODULE ADAPTER

(75) Inventors: Keith D. Mease, Gibbstown, NJ (US);
Mark A. Capriotti, Thornton, PA (US);
Kenneth J. Neeld, West Chester, PA (US)

(73) Assignee: Unisys Corporation, Blue Bell, PA (US)

( * ) Notice: Subject to any disclaimer, the term of this patent is extended or adjusted under 35 U.S.C. 154(b) by 0 days.

(21) Appl. No.: 11/647,694

(22) Filed: Dec. 29, 2006

(51) Int. Cl.
*H05K 7/00* (2006.01)

(52) U.S. Cl. .................................. 361/679.02

(58) Field of Classification Search ................ 361/684, 361/220, 212, 2; 710/100–103; 307/11, 307/36, 42
See application file for complete search history.

(56) References Cited

U.S. PATENT DOCUMENTS 6,098,132 A * 8/2000 Olarig et al. ................ 710/302
6,222,708 B1 * 4/2001 Severson et al. ............... 361/2
6,425,027 B1 * 7/2002 Mills et al. .................. 710/300
6,992,899 B2 * 1/2006 Alger et al. ................. 361/767
7,365,964 B2 * 4/2008 Donahue, IV ............... 361/622

* cited by examiner

*Primary Examiner*—Jean F Duverne
(74) *Attorney, Agent, or Firm*—Richard J. Gregson; Robert P. Marley; RatnerPrestia

(57) ABSTRACT

Memory module adapters and methods for connecting memory modules to computing systems are disclosed. The memory module adapter includes memory connectors, a multi-memory connector, and a support that supports the memory connectors and multi-memory connector. The memory connectors are electrically connected to the multi-memory connector. Memory modules are connected to a computing system by inserting the memory modules along a first insertion axis into a memory connector of a memory module adapter and inserting the memory module adapter along a second insertion axis to a platform connector of a computing platform within the computing system.

14 Claims, 7 Drawing Sheets

MEMORY MODULE ADAPTER

RELATED APPLICATIONS

This application is related to the U.S. patent application Ser. No. 11/540,462 entitled PERIPHERAL CARD ADAPTER by inventors Daniel A. Jochym, Kenneth J. Neeld, Mark W. Wessel, Sean McClain, and Keith D. Mease, filed on Sep. 29, 2006, which claims priority to U.S. Provisional Patent Application No. 60/722,161 filed on Sep. 30, 2005, both of which are incorporated fully herein by reference.

FIELD OF THE INVENTION

The present invention relates to computing systems and, more particularly, to methods and apparatus for installing memory modules with computing systems such as personal computers, servers, workstations, and the like.

BACKGROUND OF THE INVENTION

Conventional memory modules for use in computing systems include one or more memory chips on a printed circuit board. To install such memory modules into a computing system, or remove memory modules therefrom, the cover of a chassis housing the computing system typically must be removed. In the case of servers, this is difficult because there may be numerous cables connected to the server that need to be disconnected such that the server can be removed from a cabinet holding the server prior to removing the cover. Depending on the number and types of cables that need to be disconnected, this may be a time consuming operation.

Several issues exist with conventional computing system designs and the ease of memory module installation. For example, service technicians are reluctant to service a computer system that is powered on with the cover removed for fear of electrical shock or causing damage to the system. Thus, the service technicians typically shut down the system to install or remove memory modules. In addition, current computing systems are designed such that memory modules are inserted into memory module slots on a computing platform such as a motherboard. Installing memory modules onto the motherboard, however, utilizes valuable space on the motherboard.

For the above reasons, there is a need for improved apparatus and methods for installing memory modules into computing systems. The present invention addresses this need among others.

SUMMARY OF THE INVENTION

The present invention is embodied in apparatus and methods for installing memory modules in a computing system. In accordance with one aspect of the invention, a memory module adapter is provided for electrically connecting memory modules to a computing platform through insertion of the memory module adapter into an input/output slot in a computing system chassis. The memory module adapter includes memory connectors, a multi-memory connector, and a support. The memory connectors are electrically connected to the multi-memory connector such that when each memory module is connected to a respective memory connector and the multi-memory connector is connected to a platform connector, the memory modules are electrically connected to the computing platform.

In accordance with another aspect of the invention, a computing system is provided. The computing system includes a computing platform and a memory module adapter. The computing platform has at least one platform connector, and the memory module adapter electrically connects memory modules to the computing platform. The memory module adapter includes memory connectors, a multi-memory connector, and a support. Each memory connector is adapted to receive a respective memory module along a first insertion axis and the multi-memory connector is adapted to receive the platform connector on the computing platform along a second insertion axis different than the first insertion axis. The memory module is electrically coupled to the computing platform when the memory connector receives the memory module and the multi-memory connector receives the platform connector. A housing supports the memory connectors and the multi-memory connector.

In accordance with another aspect of the invention, a method for electrically connecting memory modules to a computing platform within a computer chassis is provided. The computer chassis has an opening for receiving a memory module adapter and the computing platform has at least one platform connector. The method includes inserting memory modules into respective memory connectors of the memory module adapter along a first insertion axis, inserting the memory module adapter into an opening in the computer chassis along a second insertion axis different than the first insertion axis, and connecting a multi-memory connector of the memory module adapter to a platform connector on the computing platform through insertion of the memory module adapter along the second insertion axis.

BRIEF DESCRIPTION OF THE DRAWINGS

The invention is best understood from the following detailed description when read in connection with the accompanying drawings, with like elements having the same reference numerals. When a plurality of similar elements are present, a single reference numeral may be assigned to the plurality of similar elements with a small letter designation referring to specific elements. When referring to the elements collectively or to a non-specific one or more of the elements, the small letter designation may be dropped. This emphasizes that according to common practice, the various features of the drawings are not drawn to scale. On the contrary, the dimensions of the various features are arbitrarily expanded or reduced for clarity. Included in the drawings are the following figures.

DETAILED DESCRIPTION OF THE INVENTION

Figure 1:
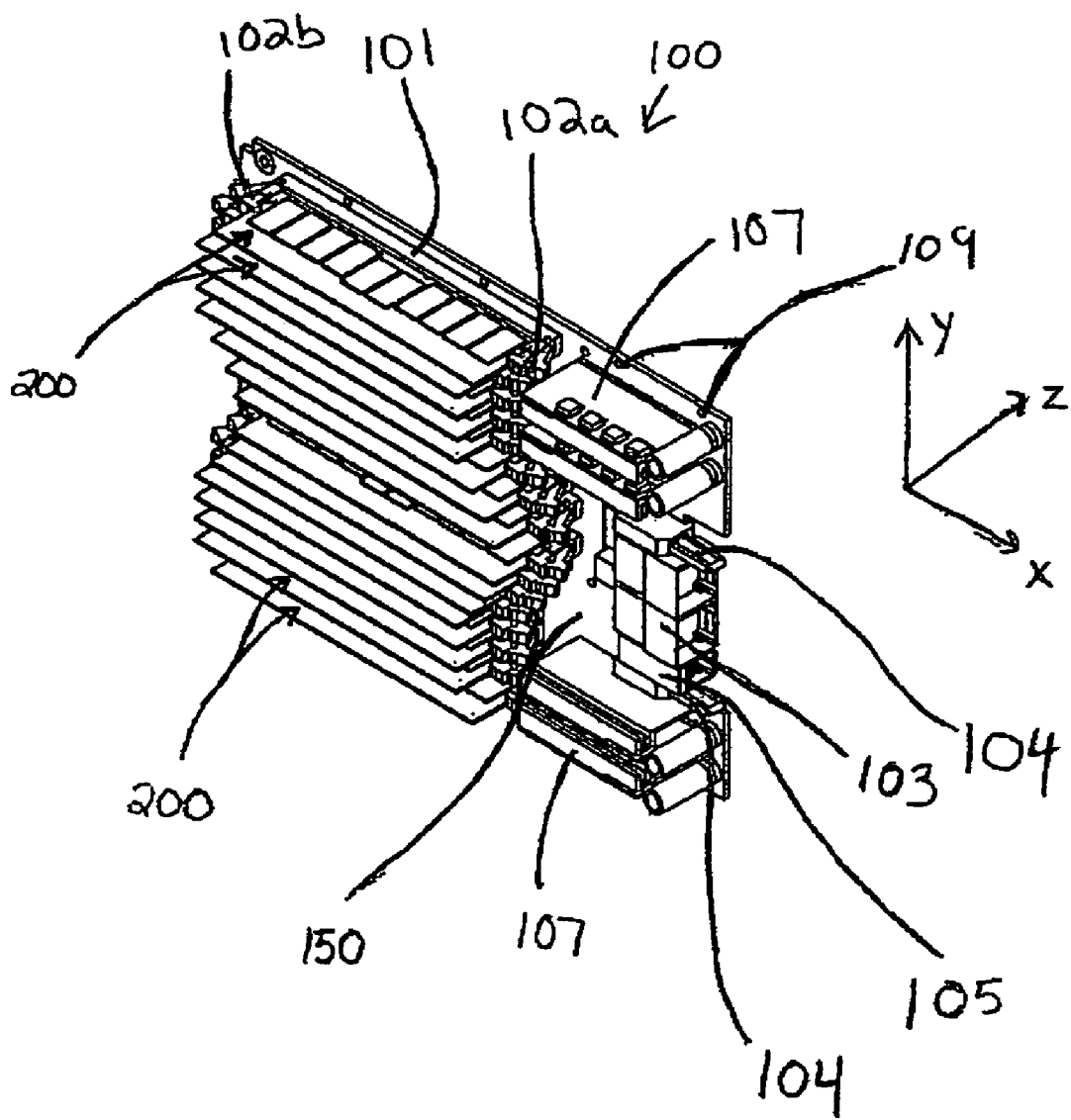
FIG. 1 is a perspective view of a memory module adapter in accordance with aspects of the invention.
Figure 2:
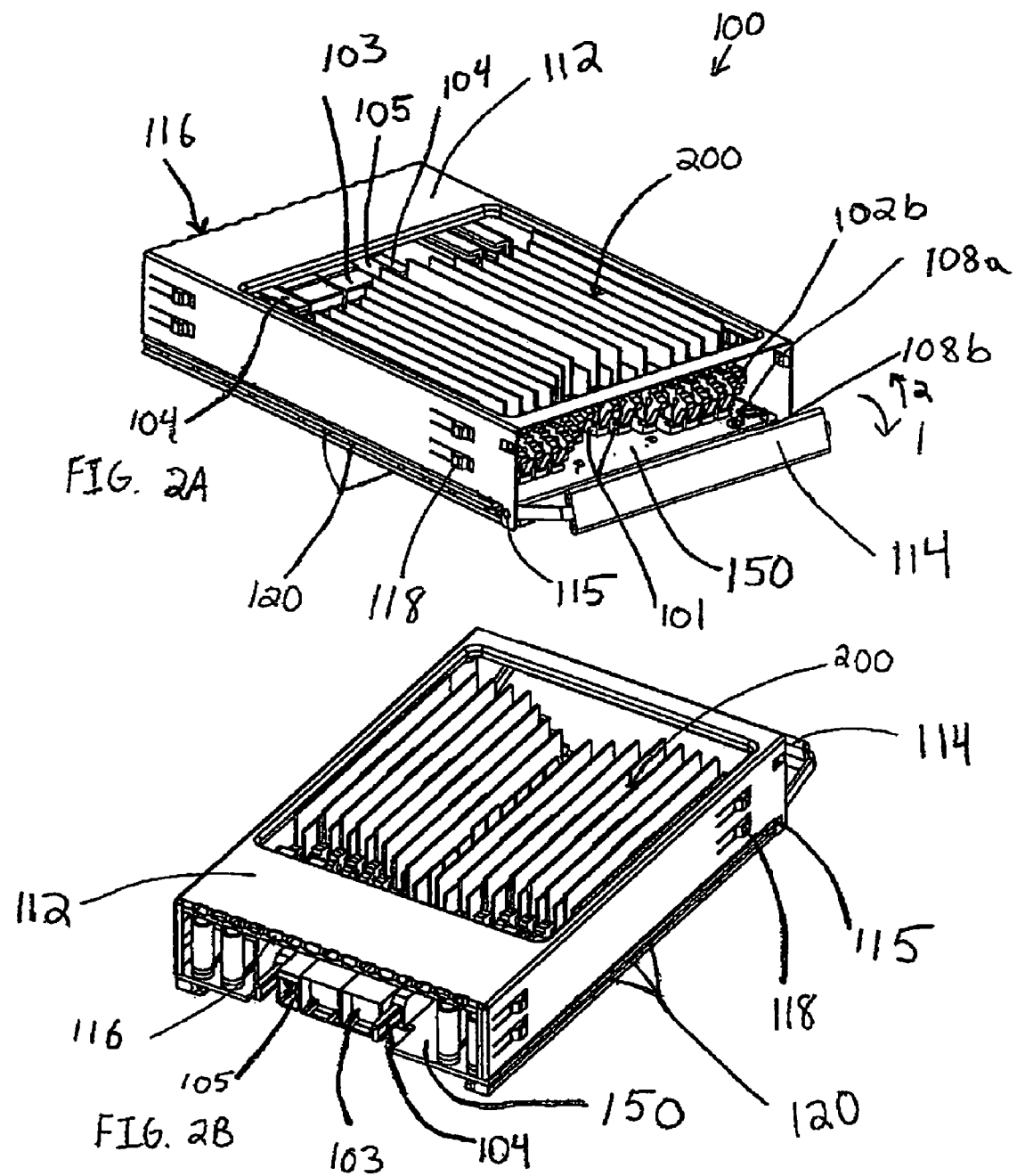
FIG. 2A is a perspective view of a memory module adapter including an enclosed housing in accordance with aspects of the invention.
FIG. 2B is a perspective view of the memory module adapter of FIG. 2A in accordance with aspects of the invention.

The invention will next be described with reference to the figures. Such figures are intended to be illustrative rather than limiting and are included herewith to facilitate the explanation of the present invention.

Referring generally to the figures (FIGS. 1-6), in accordance with an exemplary embodiment, a memory module adapter 100 is provided having a plurality of memory connectors 101 (one of which is readily visible), a multi-memory connector 103, and a support 150. The memory module adapter 100 is configured to receive memory modules 200 along a first insertion axis (e.g., z-axis) such that a board connector (not shown) of each memory module 200 connects with a respective memory connector 101.

After memory modules 200 are secured within the memory module adapter 100, the memory module adapter 100 is inserted into an input/output (I/O) slot 402 of a computing system chassis 401 along a second insertion axis (e.g., x-axis) that extends through the I/O slot and that is different than the first insertion axis (e.g., z-axis). Insertion of the memory module adapter 100 along the second insertion axis (e.g., x-axis) connects a platform connector 301 on a computing platform 300 to the multi-memory connector 103. This arrangement enables the coupling/decoupling of the memory module 200 to/from the computing platform 300 without having to remove a cover from the computing system chassis 401. Thus, the memory module adapter 100 (and the memory modules 200 therein) may be inserted/removed from a computing system 400 while the computing system 400 is powered on, i.e., a hot swap.

Referring now to the individual figures in detail, FIGS. 1, 2A, and 2B depict exemplary embodiments of a memory module adapter 100. The memory module adapter 100 includes a support 150 (e.g., printed circuit board) that has a plurality of memory connectors 101 coupled thereto. The memory connectors 101 are adapted to receive memory modules 200 along a first insertion axis (e.g., the z-axis shown in FIG. 1) such that a board connector of a memory module 200 is coupled to a respective memory connector 101.

In an exemplary embodiment, each memory connector 101 has at least one associated memory module latch (e.g., latches 102a, 102b that are coupled to the ends of that memory connector 101). The illustrated memory module latches 102a, 102b are configured to secure a respective memory module 200 in a memory connector 101 by positioning at least one memory module latch 102a, 102b in contact with a board edge (not shown) of the memory module 200. When the memory module 200 is coupled to a respective memory connector 101 and at least one memory module latch 102a, 102b contacts an edge of the memory module 200, the memory module 200 is secured within the memory module adapter 100. When the memory module 200 is to be removed from the memory module adapter 100, memory module latches 102a, 102b may be positioned away from the memory module 200 to release the memory module 200 from the memory connector 101 and, thus, the memory module adapter 100. In an alternative exemplary embodiment, memory modules 200 may be secured to the memory module adapter 100 through insertion alone (e.g., through a friction fit) without the use of a separate memory module latch 102a, 102b.

Exemplary memory modules 200 include, for example, SIMMs, DIMMs, or essentially any type of memory module for use in a computing system. In the illustrated embodiments, the memory module adapter 100 includes sixteen memory connectors 101. It is contemplated, however, that the memory module adapter 100 may include more or less than sixteen memory connectors 101. Memory modules 200 may be added to the memory module adapter 100 as needed, thereby allowing the memory capacity of the memory module adapter 100 to grow with the performance needs of the computing system.

Memory connectors 101 are supported by support 150 and are electrically connected to a multi-memory connector 103 (described below; e.g., through support 150). In the illustrated embodiment, the memory connectors 101 are offset in a longitudinal direction (i.e., along the x-axis) on a surface of the support 150 such that the memory connectors 101 in the middle of the support 150 are spaced closer to the multi-memory connector 103 in the longitudinal direction to minimize connection distances between the multi-memory connector 103 and those connectors 101. Memory connectors 101 may have other spatial arrangements (e.g., closer/farther from the multi-memory connector 103 to optimize the connection distances between the memory connectors 101 and the multi-memory connector 103). Additionally, memory connectors 101 may be coupled on support 150 in arrangements that optimizes space on the support 150.

A multi-memory connector 103 is coupled to the support 150. The multi-memory connector 103 is electrically connected to the memory connectors 101 (e.g., through the support) and is adapted to receive a platform connector (301, FIG. 3) of a computing platform (described below) along a second insertion axis (e.g., along the x-axis shown in FIG. 1) different than the first insertion axis (e.g., along the z-axis). In an exemplary embodiment, the first insertion axis and the second insertion axis may be substantially perpendicular with respect to each other. When a memory module 200 is connected to the memory connector 101 and the multi-memory connector 103 is connected to a platform connector (320, FIG. 3), the memory module 200 becomes electrically connected to the computing platform (300, FIG. 3). This arrangement enables the coupling of a memory module 200 within the memory module adapter 100 to the computing platform (300, FIG. 3) without having to remove a cover of a computing system chassis (401, FIG. 4). Thus, the memory module adapter 100 can be installed/removed/replaced quickly and easily while the computing system is powered on, i.e., it is hot swappable, without concern for damaging components within the chassis.

The illustrated memory module adapter 100 includes a power connector 105 coupled to the support 150. The power connector 105 may be adjacent the multi-memory connector 103 and is electrically coupled to power regulators 107 (described below). The power connector 105 is adapted to receive a power interface (310, FIG. 3) on the computing platform (300, FIG. 3) such that electricity may be supplied to the memory module adapter 101. When the power connector 105 is connected to a power interface (310, FIG. 3) of the computing platform (300, FIG. 4), electricity is transmitted from the power connector 105 to the power regulators 107 on the memory module adapter 100. The power regulators 107 distribute electricity to the memory connectors 101 so that memory modules 200 connected to the memory connectors 101 may be powered. Additionally, the power regulators 107 may protect the memory modules 200 from sudden voltage/current spikes by regulating the voltage through the memory connectors 101.

The illustrated memory module adapter 100 also has protrusions 104 adjacent the multi-memory connector 103 and the power connector 105. The protrusions 104 are configured to be received by channels (302, FIG. 3) for mating with the protrusions 104 on a computing platform such as a motherboard (300, FIG. 3). In an exemplary embodiment, when the memory module adapter 100 is inserted into an input/output slot (402, FIG. 4) of a computing system chassis (401, FIG. 4), the protrusions 104 align with channels (302, FIG. 3) to align the memory module adapter 100 in the computing system (400, FIG. 5).

FIGS. 2A and 2B illustrate perspective views of components of an exemplary memory module adapter 100 with an optional housing 112 in accordance with various aspects of the present invention. The housing 112 is coupled to the support 150 (e.g., via screw openings 109, FIG. 1) and at least partially encloses the support 150, the memory connectors 101, and the multi-memory connector 103. In an exemplary embodiment, the housing 112 includes a handle 114 coupled thereto. The handle 114 is coupled to the housing 112 via hinges 115 such that the handle 114 may be positioned away from the housing 112 (e.g., direction indicated by arrow 1). When the handle 114 is positioned away from the housing 112, the handle 114 may be grasped by a person to carry and/or pull the memory module adapter 100 from a computing system (400, FIG. 4). In an exemplary embodiment, after the memory module adapter 100 has been inserted into an input/output slot of a computing system chassis (described below), the handle 114 may be positioned towards the housing 112 (e.g., direction indicated by arrow 2) to secure the memory module adapter 100 within the input/output slot.

Handle 114 actuates levers (122, FIG. 5B) that are interconnected with a lever receiving mechanism (described below). Suitable lever 122 and lever receiving mechanism will be of understood by one of skill in the art from the description herein.

Housing 112 further includes vents 116 to provide air flow through the memory module adapter 100 and cool memory modules 200 coupled to the adapter 100. Additionally, protrusions 118 may extend from the side of the housing 112 to stabilize/ground the memory module adapter 100 in a computing system chassis (401, FIG. 4) when the adapter 100 has been installed into an input/output slot on the computing system (400, FIG. 4). The housing 112 may also have grounding contacts 120 adjacent the printed circuit board 150.

The memory module adapter 100 may further include one or more status light emitting diodes (LEDs) 108a, 108b that are coupled to the printed circuit board 150. The LEDs 108a, 108b are electrically connected to at least one of the memory connectors 101, the multi-memory connector 103, or power connector 105 and may have different light emitting colors (e.g., red and green) to indicate the operating status of the memory module adapter 100. For example, the LEDs 108a, 108b may indicate the current-power state of a memory module 200 within the memory module adapter 100 and when the adapter 100 may be safely removed from the computing system. In an exemplary embodiment, when power is supplied to the memory connectors 101, a red LED may be lit to indicate that it is not safe to remove the memory module adapter 100 from the computing system. When power is not supplied to the memory connectors 101, a green LED may be illuminated to indicate that the memory module adapter 100 may be safely removed from the computing system.

Figure 3:
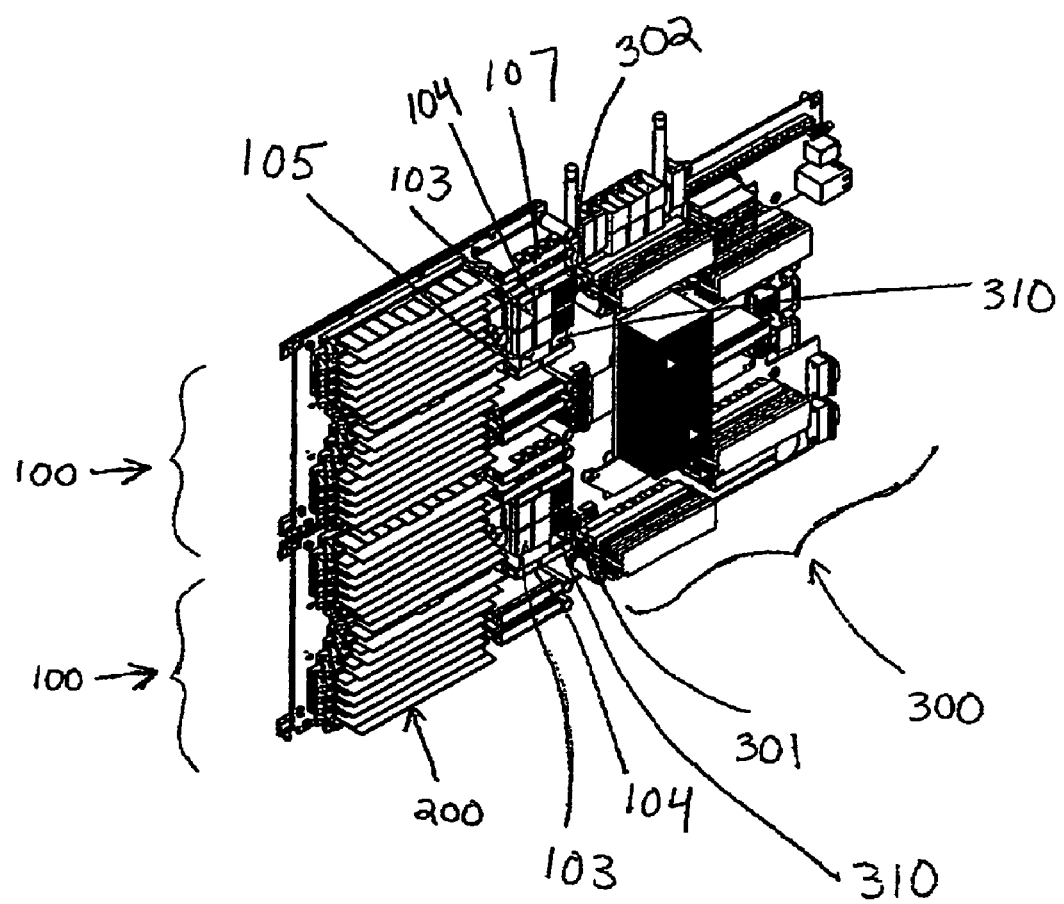
FIG. 3 is a perspective view of two memory module adapters coupled to a computing platform in accordance with aspects of the invention.

FIG. 3 depicts a perspective view of an exemplary embodiment of memory module adapters 100 coupled to a computing platform 300. The computing platform 300 includes platform connectors 301, channels 302, and power interfaces 310. In an exemplary embodiment, after a memory module 200 has been inserted into a respective memory connector 101 along a first insertion axis (e.g., along the z-axis shown in FIG. 1), the memory module adapter 100 may be inserted into an input/output slot (402, FIG. 4) of a computing system chassis (401, FIG. 4) along a second insertion axis (e.g., along the x-axis shown in FIG. 1).

When the memory module adapter 100 is inserted into the input/output slot of the computing system chassis, the multi-memory connector 103 of the memory module adapter 100 couples with the platform connector 301 of the computing platform 300. Additionally, the power interfaces 310 and channels 302 of the computing platform 300 may couple the power connectors 105 and protrusions 104, respectively of the memory module adapter 100. Thus, the memory module adapter 100 may be inserted or removed from a computing system (400, FIG. 5) without removing a cover or powering off the computing system.

Figure 4A:
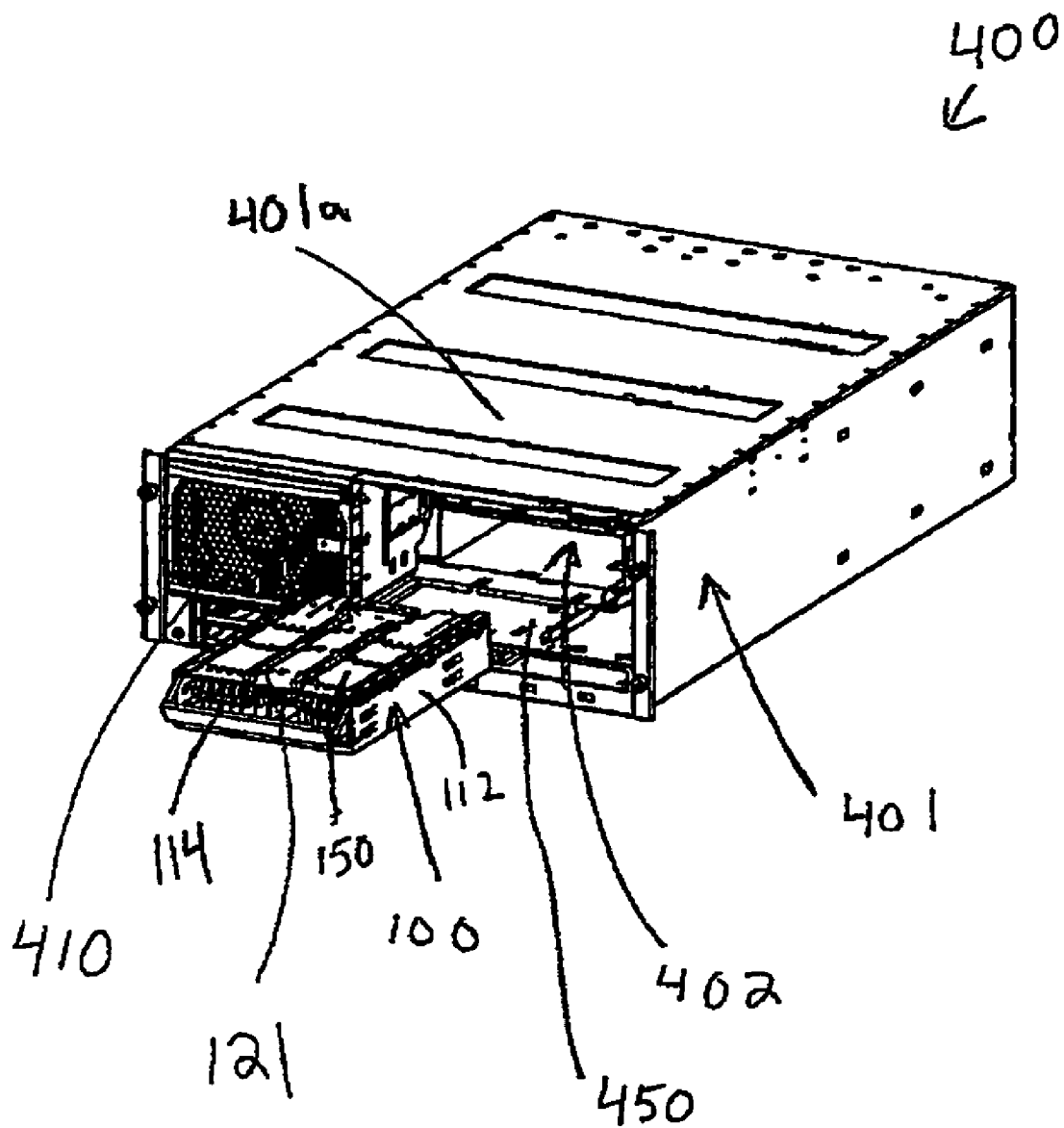
FIG. 4A is a perspective view of a memory module adapter being inserted into a computing system in accordance with aspects of the invention.
Figure 4B:
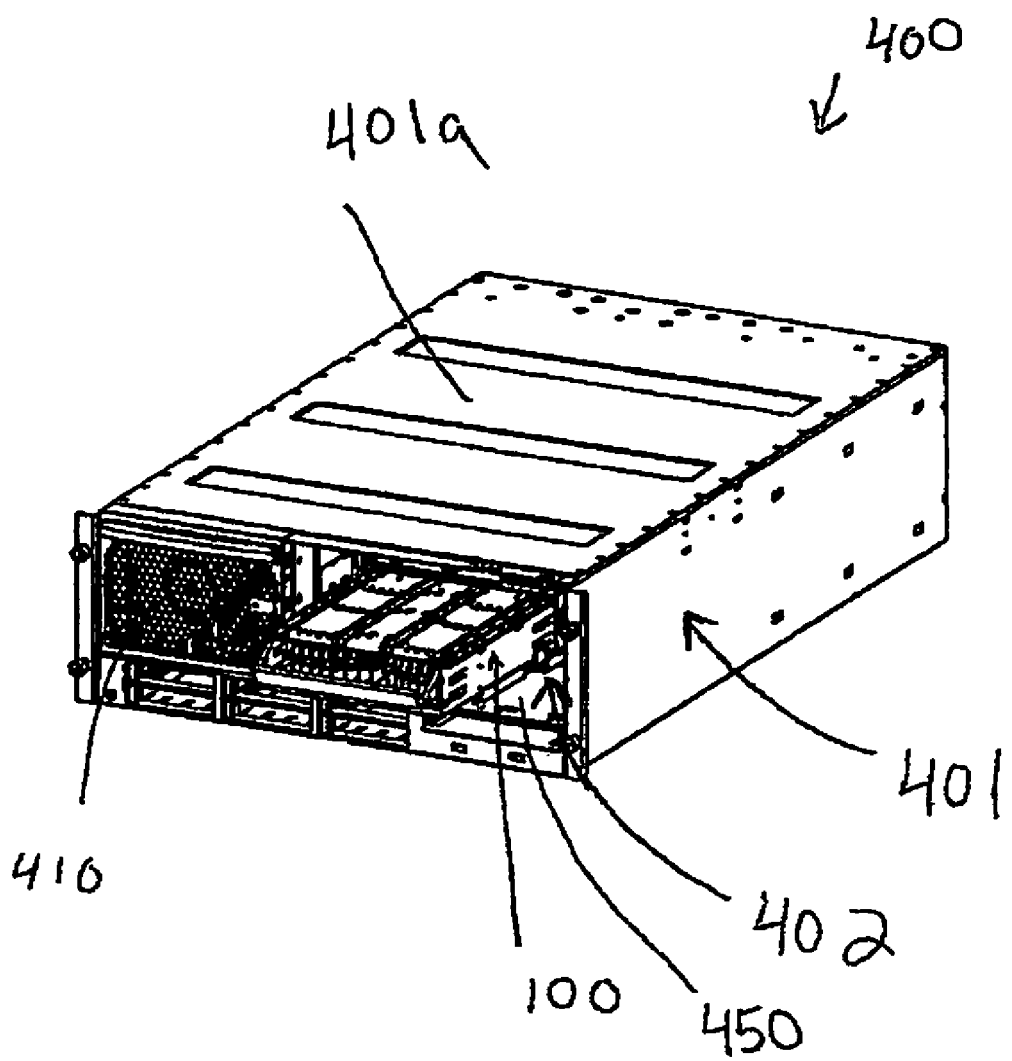
FIG. 4B is a perspective view of a memory module adapter partially inserted into a computing system in accordance with aspects of the invention.

In an exemplary embodiment, two memory module adapters 100 may be inserted into input/output slots of a computing system chassis. The use of two memory module adapters 100 for coupling to the computing platform 300 provides a redundant memory system so that one memory module adapter 100 may be used in the computing system while a second memory module adapter 100 is being removed/replaced FIGS. 4A and 4B depict perspective views of a computing system 400 with a memory module adapter 100 being inserted into a computing system chassis 401 through an input/output slot 402 according to various aspects of the present invention. The illustrated computing system 400 includes a chassis 401 having an interior 450 and an input/output slot 402 leading to the interior 450. The computer system chassis 401 may include one or more input/output slots 402 to allow one or more memory module adapters 100 to couple to a computing platform (300, FIG. 3) housed within the chassis 401. Other electrical components 410 may also be housed within chassis 401 including, but not limited to, input/output cards, cooling fans, and optical devices.

In an exemplary embodiment, the memory module adapter 100 is oriented such that the bottom of the printed circuit board 150 is oriented towards a top portion 401a of the chassis 401. The printed circuit board 150 bottom may include flanges 121 that align the memory module adapter 100 in the input/output slot 402. As described above, when memory modules 200 are coupled to respective memory connectors 101, latches 102a, 102b of each memory connector 101 may secure the memory modules 200 to the memory module adapter 100. In the event that memory modules 200 need to be installed/replaced, the entire memory module adapter 100 may be removed from the input/output (I/O) slot 402 (e.g., by lifting and pulling via handle 114) and the memory modules 200 may be installed within the removed memory module adapter 200. The computing system 400 may be powered down when the memory module adapter 100 is removed. Alternatively, the computing system 400 may be continuously powered during removal/replacement of the memory module adapter 100.

Figure 5A:
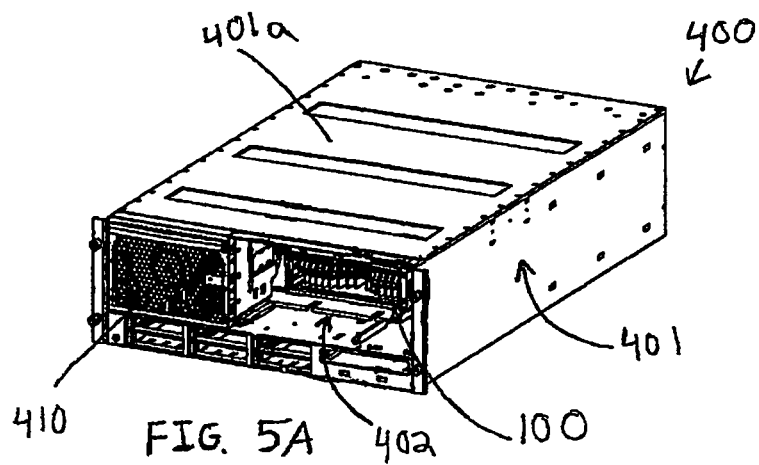
FIG. 5A is a perspective view of a memory module adapter inserted into a computing system in accordance with aspects of the invention.
Figure 5B:
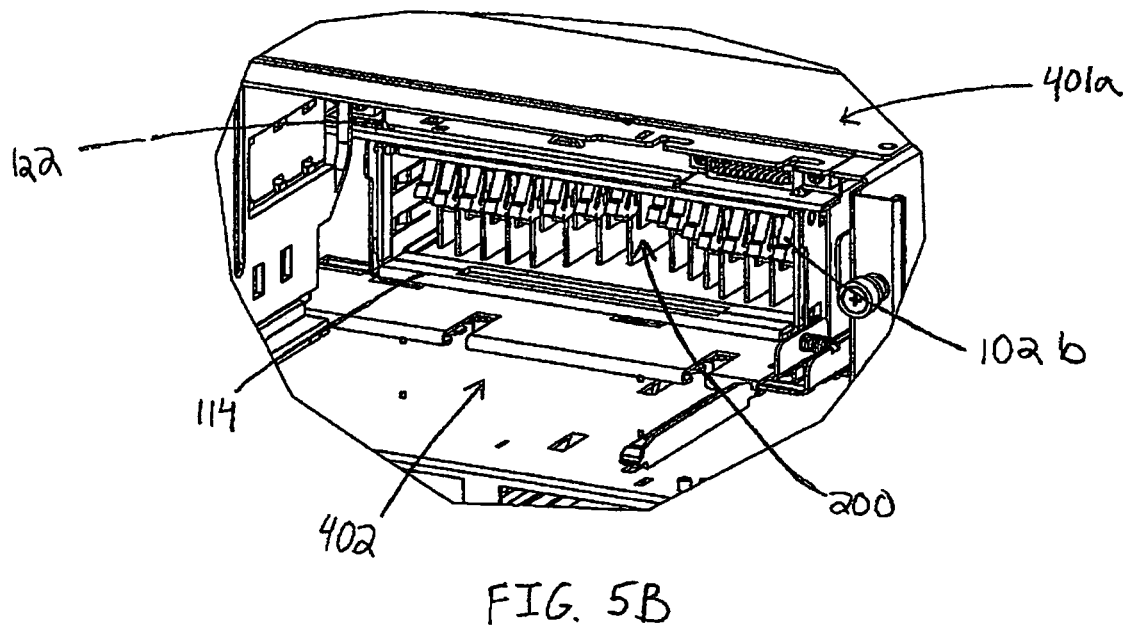
FIG. 5B is an exploded view of a portion of the memory module adapter inserted into a computing system of FIG. 5A in accordance with aspects of the invention.

FIGS. 5A and 5B illustrate a memory module adapter 100 fully inserted within an input/output slot 402 of a computing system chassis 401. As depicted in the partially exploded view of the input/output slot 402 in FIG. 5B, when the memory module adapter 100 is fully inserted into the chassis, the handle 114 may be positioned toward housing 112 in a retracted position. When the handle is retracted, a lever 122 of the handle 114 is actuated towards the top portion 401a of the chassis 401, thereby locking the memory module adapter 100 in the computing system chassis 401.

Figure 6:
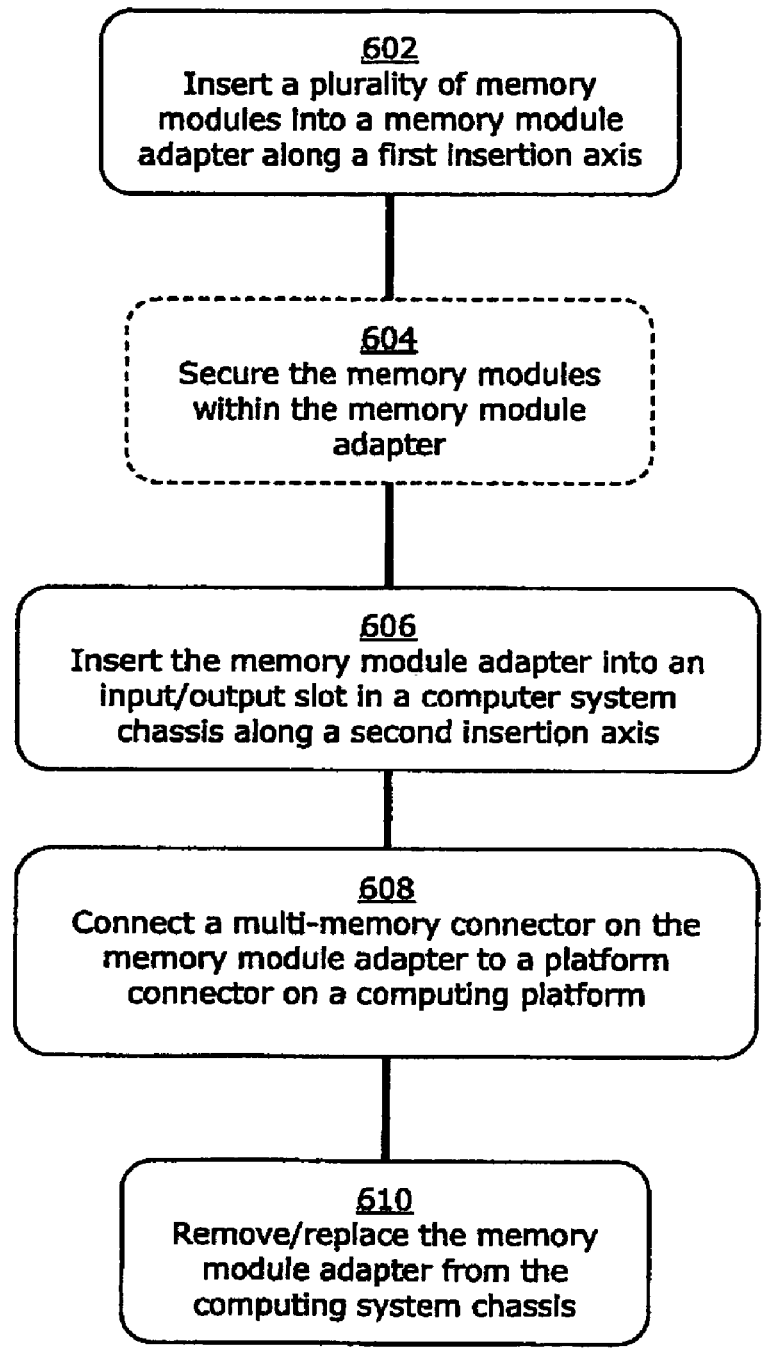
FIG. 6 is a flow chart of exemplary steps for using a memory module adapter in accordance with aspects of the invention.

FIG. 6 depicts a flow chart 600 of exemplary steps for using a memory module adapter 100 in accordance with the present invention. The step will be described with reference to FIGS. 1-5B.

At step 602, memory modules 200 are inserted into a memory module adapter 100 along a first insertion axis (e.g., z-axis). In an exemplary embodiment, when the memory module 200 is inserted into the memory module adapter 100, the board connector of each memory module 200 connects to a respective memory connector 102 on the memory module adapter 100.

Optionally, at step 604, the memory modules 200 are secured within the memory module adapter 100. In an exemplary embodiment, the memory modules 200 are secured by one or more memory module latches 102a, 102b. In an alternative exemplary embodiment, the insertion of the memory module 200 into the memory module adapter 100, secures the memory module 200 within the adapter 100 in which case step 604 may be omitted.

At step 606, the memory module adapter 100 with attached memory modules 200 is inserted into an input/output slot 402 of a computer system chassis 401 along a second insertion axis (e.g., x-axis) extending through the input/output slot 402 and that is different than the first insertion axis.

At step 608, a multi-memory connector 103 on the memory module adapter 100 is connected to a platform connector 301 on the computing platform 300 to electrically connect the memory modules 200 thereto. In an exemplary embodiment, connection of the multi-memory connector 103 of the memory module adapter 100 to the platform connector 301 of the computing platform 300 is accomplished through insertion of the memory module adapter 100 along the second insertion axis. When the multi-memory connector 103 is connected to the platform connector 301, the memory module 200 is electrically connected to a computing platform 300 such as a computer motherboard. In an exemplary embodiment, when the memory module adapter 100 is connected to a platform connector 301 on the computing platform 300, a handle 114 may be positioned in a retracted position to actuate a lever 122 and lock the memory module adapter 100 in the computing system chassis 401 to prevent accidental removal of the adapter 100. When power is supplied through the power connector 105 of the memory module adapter 100, the computing system 400 may send a signal to the memory module adapter 100 that causes a red LED to illuminate, thereby indicating that the adapter 100 should not be removed from the computing system 400.

At step 610, the memory module adapter 100 is removed/replaced. In an exemplary embodiment, the memory module adapter 100 may be removed/replaced while computing system 400 is powered on. When power is not supplied through the power connector 105, the computing system may send a signal to the memory module adapter 100 that causes a green LED to illuminate, thereby indicating that it is safe to remove adapter 100. In an exemplary embodiment, the memory module adapter 100 is removed by positioning handle 114 to an extracted position, thereby extending the lever 122 and unlocking the memory module adapter 100 from the computing system chassis 401. The memory module adapter 100 may then be pulled from the computing system 400 along the same axis used for insertion (i.e., the second insertion axis) in an opposite direction. Replacement of the removed memory module adapter 100 may be accomplished through performance of steps 602-608 described above.

Although the present invention has been particularly described in conjunction with specific embodiments, many alternatives, modifications, and variations will be apparent to those skilled in the art from the description herein. It is therefore contemplated that the appended claims will embrace any such alternatives, modifications, and variations as falling within the true scope and spirit of the present invention.

What is claimed is:

1. A memory module adapter for electrically connecting a plurality of memory modules to a computing platform through an input/output slot in a chassis housing the computing platform, the computing platform having at least one platform connector, the memory module adapter comprising:
  a printed circuit board;
  a plurality of memory connectors mounted on the printed circuit board, each memory connector adapted to receive a board edge of a respective memory module along a first insertion axis;
  a multi-memory connector electrically connected to said plurality of memory connectors, said multi-memory connector mounted on the printed circuit board and adapted to receive a platform connector of the computing platform along a second insertion axis extending through the input/output slot in the chassis, the second insertion axis different than the first insertion axis, whereby each memory module is electrically coupled to the computing platform when it is received by its respective memory connector and the multi-memory connector receives the platform connector; and
  a housing at least partially enclosing the printed circuit board, the plurality of memory connectors, and the multi-memory connector, the housing sized to be received into the input/output slot of the chassis.

2. The memory module adapter of claim 1, wherein the memory module adapter further includes a power connector adapted to mate with a power interface on the computing platform.

3. The memory module adapter of claim 2, wherein the memory module adapter further includes a power regulator electrically coupled to the power connector and the plurality of memory connectors.

4. The memory module adapter of claim 1, wherein the memory module adapter further includes a protrusion coupled to the support and adapted to mate with a channel on the computing platform.

5. The memory module adapter of claim 1, wherein the memory module adapter includes at least one memory module latch associated with each of said plurality of memory connectors.

6. The memory module adapter of claim 1, wherein the memory module adapter includes at least one status light emitting diode (LED) configured to indicate an operation status of the memory module adapter.

7. The memory module adapter of claim 1, wherein at least one memory connector is offset in a longitudinal direction on the support with respect to at least one other memory connector.

8. The memory module adapter of claim 1, wherein the computing platform is a motherboard.

9. The memory module adapter of claim 1, wherein the housing is coupled to the printed circuit board.

10. A computing system comprising:
  a chassis having an input/output slot for receiving a memory module adapter within the chassis;

a computing platform housed within the chassis and having at least one platform connector; and a memory module adapter for electrically connecting a plurality of memory modules to the computing platform, the memory module adapter comprising:

a printed circuit board;

a plurality of memory connectors mounted on the printed circuit board, each memory connector adapted to receive a board edge of a respective memory module along a first insertion axis;

a multi-memory connector electrically connected to said plurality of memory connectors, said multi-memory connector mounted on the printed circuit board and adapted to receive a platform connector of the computing platform along a second insertion axis extending through the input/output slot in the chassis, the second insertion axis different than the first insertion axis, whereby each memory module is electrically coupled to the computing platform when it is received by its respective memory connector and the multi-memory connector receives the platform connector; and a housing at least partially enclosing the printed circuit board, the plurality of memory connectors, and the multi-memory connector, the housing sized to be received into the input/output slot of the chassis.

11. The computing system according to claim 10, wherein the first insertion axis is substantially perpendicular to the second insertion axis.

12. The computing system according to claim 10, wherein at least one memory connector is offset in a longitudinal direction on the support with respect to least one other memory connector.

13. The computing system according to claim 10, wherein the computing platform is a motherboard.

14. The computing system according to claim 10, wherein the housing is coupled to the printed circuit board.

* * * * *